(12) United States Patent
Seger

(10) Patent No.: US 10,091,481 B2
(45) Date of Patent: Oct. 2, 2018

(54) SENSOR MODULE, METHOD FOR ASCERTAINING A BRIGHTNESS AND/OR THE COLOR OF AN ELECTROMAGNETIC RADIATION AND METHOD FOR MANUFACTURING A SENSOR MODULE

(71) Applicant: Robert Bosch GmbH, Stuttgart (DE)

(72) Inventor: Ulrich Seger, Leonberg-Warmbronn (DE)

(73) Assignee: ROBERT BOSCH GMBH, Stuttgart (DE)

( * ) Notice: Subject to any disclaimer, the term of this patent is extended or adjusted under 35 U.S.C. 154(b) by 57 days.

(21) Appl. No.: 15/489,977

(22) Filed: Apr. 18, 2017

(65) Prior Publication Data

US 2017/0339387 A1 Nov. 23, 2017

(30) Foreign Application Priority Data

May 17, 2016 (DE) .................. 10 2016 208 409

(51) Int. Cl.
| | |
|---|---|
| *H04N 5/33* | (2006.01) |
| *H04N 5/30* | (2006.01) |
| *H04N 9/77* | (2006.01) |
| *H01L 27/146* | (2006.01) |
| *H04N 9/04* | (2006.01) |

(52) U.S. Cl.
CPC ......... *H04N 9/77* (2013.01); *H01L 27/14605* (2013.01); *H01L 27/14621* (2013.01); *H01L 27/14683* (2013.01); *H04N 5/33* (2013.01); *H04N 9/045* (2013.01)

(58) Field of Classification Search
CPC . H04N 9/77; H04N 9/045; H04N 5/33; H01L 27/14605; H01L 27/14621; H01L 27/14683
USPC ........ 348/164, 162, 163, 143, 151, 159, 161
See application file for complete search history.

(56) References Cited

U.S. PATENT DOCUMENTS

| | | | |
|---|---|---|---|
| 5,172,220 A | 12/1992 | Beis | |
| 7,315,241 B1* | 1/2008 | Daily | ..................... G02B 27/01 340/332 |
| 2007/0139174 A1* | 6/2007 | Perkes | ..................... B60R 1/12 340/435 |
| 2007/0153104 A1 | 7/2007 | Ellis-Monaghan et al. | |
| 2008/0043125 A1 | 2/2008 | Kozlowski | |
| 2014/0231654 A1* | 8/2014 | Reid | ......................... G01T 1/24 250/366 |
| 2015/0054997 A1 | 2/2015 | Hynecek | |

FOREIGN PATENT DOCUMENTS

| | | |
|---|---|---|
| EP | 1594321 A2 | 11/2005 |
| EP | 1679907 A1 | 7/2006 |

* cited by examiner

*Primary Examiner* — Robert Chevalier
(74) *Attorney, Agent, or Firm* — Norton Rose Fulbright US LLP; Gerard Messina

(57) ABSTRACT

A sensor module including at least one brightness sensor element for detecting a brightness of a wideband electromagnetic radiation and at least one color sensor field, which includes at least one color sensor element for detecting a color of the electromagnetic radiation. The brightness sensor element has a larger sensor surface than the color sensor field.

11 Claims, 4 Drawing Sheets

SENSOR MODULE, METHOD FOR ASCERTAINING A BRIGHTNESS AND/OR THE COLOR OF AN ELECTROMAGNETIC RADIATION AND METHOD FOR MANUFACTURING A SENSOR MODULE

CROSS REFERENCE

The present application claims the benefit under 35 U.S.C. § 119 of German Patent Application No. DE 102016208409.7 filed on May 17, 2016, which is expressly incorporated herein by reference in its entirety.

BACKGROUND INFORMATION

Modern image sensors may include an orthogonal grid made up of individual sensor cells. Depending on the application, the individual sensor cells may be implemented with or without a color filter.

SUMMARY

In accordance with the present invention, a sensor module, a method for ascertaining a brightness and/or a color of an electromagnetic radiation using a sensor module, a method for manufacturing a sensor module and a device using these methods are provided. Advantageous refinements of and improvements of the present invention are described herein.

In accordance with an example embodiment of the present invention, a sensor module is provided which includes:

at least one brightness sensor element for detecting a brightness of a wideband electromagnetic radiation; and at least one color sensor field having at least one color sensor element for detecting a color of the electromagnetic radiation, the brightness sensor element having a larger sensor surface than the color sensor field.

The sensor module may be, for example, an image sensor for a vehicle camera. A brightness sensor element may be understood to be a light-sensitive pixel for detecting an intensity of the electromagnetic radiation. For example, the brightness sensor element may be a wideband monochrome sensor element. A color sensor field may be understood to be a planar system made up of at least one color sensor element. For example, the color sensor field may be a cluster or an array of at least two pixels as color sensor elements. The color sensor elements may, for example, form a Bayer matrix and be situated in an orthogonal grid. In this case, the color sensor field may be covered with a color filter for filtering certain colors from a spectrum of the electromagnetic radiation. The electromagnetic radiation may be in particular visible light or light in the near-infrared range. A sensor surface may be understood to be a light-sensitive surface of the brightness sensor element or the color sensor field. For example, the brightness sensor element may have at least twice as large a sensor surface as the color sensor field.

The brightness sensor element may be formed, for example, as a square or polygon. In particular, the brightness sensor element may be designed as an irregular cruciform dodecagon.

The color sensor field may be formed to be at least quadrangular, in particular rectangular or square. Likewise, the color sensor element may also be formed to be at least quadrangular, in particular rectangular or square.

In accordance with the present invention, a suitable positioning of sensor cells of varying size makes it possible to achieve high light sensitivity and simultaneously high spatial resolution for a brightness and color detection in a sensor module. In particular, an approximately aliasing-free scanning of corresponding coloring and monochrome sensor elements may be achieved while having the same optical local resolution for a luminance and color channel. Such a sensor array system is suitable, for example, for machine vision and offers the advantage of a good compromise between light sensitivity, spatial resolution, color fidelity and manufacturing costs.

According to one specific embodiment, the brightness sensor element may have at least twice as large a sensor surface as the color sensor field. As a result, a particularly high light sensitivity of the sensor module may be ensured.

According to another specific embodiment, the sensor module may have a larger number of color sensor fields and/or color sensor elements than brightness sensor elements. For example, the sensor module may have at least four times as many color sensor elements than brightness sensor elements. As a result, a spatial resolution of the sensor module may be increased without enlarging a total sensor surface of the sensor module.

It may be advantageous if the color sensor field has at least one additional color sensor element for detecting an additional color of the electromagnetic radiation. As a result, the color sensor field is able to detect different colors.

Furthermore, the brightness sensor element may have at least one indentation. The color sensor array may be at least partially situated in the indentation. The indentation may be, for example, a rectangular or square recess in an edge area of the brightness sensor element. In particular, the indentation may be formed in a corner area of the brightness sensor element. The color sensor field may be positioned in the indentation in such a way that the indentation is at least for the most part filled by the color sensor element. For example, the brightness sensor element may be essentially in the shape of a cross. In this case, the color sensor element may be at least partially situated in an indentation delimited by two beams of the cross. The cross may, for example, have four point-symmetrically situated indentations. This embodiment makes a particularly compact design of the sensor module possible.

According to another specific embodiment, the brightness sensor element may be manufactured using a method of solid-state semiconductor technology, organic semiconductor or hybrid manufacturing technology. In addition or alternatively, the color sensor field may also be manufactured using the method of semiconductor technology. As a result, the sensor module may be manufactured efficiently and cost-effectively in large quantities.

It is also advantageous if the sensor module includes at least one additional brightness sensor element for detecting the brightness of the electromagnetic radiation and, in addition or alternatively, at least one additional color sensor field which has at least one additional color sensor element for detecting the color of the electromagnetic radiation. The additional brightness sensor element may have a larger sensor surface than the color sensor field or the additional color sensor field. For example, the sensor module may be implemented to have a plurality of brightness sensor elements and a plurality of color sensor fields. This specific embodiment makes it possible to significantly increase the light sensitivity and the spatial resolution of the sensor module.

In relation to the brightness sensor element, the color sensor field and the additional color sensor field may be situated essentially point-symmetrically to one another. This makes a space-saving, symmetrical alignment between color sensor fields and brightness sensor elements possible.

According to another specific embodiment, the color sensor field or, in addition or alternatively, the additional color sensor field may be situated at least partially within a circumference around a center point of the brightness sensor element. Here, a diameter of the circumference may correspond to a maximum of double the distance between the center point of the brightness sensor element and a center point of the additional brightness sensor element. As a result, a high sensitivity for a gray-value-based object recognition may also be ensured in highly differently illuminated scenes.

It is also an advantage if the brightness sensor element and the additional brightness sensor element are essentially of equal size. In addition or alternatively, the color sensor field and the additional color sensor field may also be essentially of equal size. As a result, the manufacture of the sensor module may be simplified. This also makes it possible for the brightness sensor elements and the color sensor fields to be aligned uniformly.

In accordance with an example embodiment of the present invention, a method is provided for ascertaining a brightness and/or a color of an electromagnetic radiation using a sensor module according to one of the above specific embodiments, the method including the following steps:

reading in a brightness value which represents a brightness detected by the brightness sensor element, and/or a color value which represents a color detected by the color sensor element; and processing the brightness value and/or the color value in order to ascertain the brightness and/or the color of the electromagnetic radiation.

Furthermore, an example embodiment of the present invention described herein provides a method for manufacturing a sensor module, the method including the following steps:

machining a substrate in order to form at least one brightness sensor element for detecting a brightness of an electromagnetic radiation and at least one color sensor field, which has at least one color sensor element for detecting a color of the electromagnetic radiation, the substrate being machined in such a way that the brightness sensor element has a larger sensor surface than the color sensor field.

The substrate may be, for example a semiconductor material, in particular a silicon-containing material. For example, the sensor module may be manufactured using a method of semiconductor technology in the step of machining.

To manufacture the sensor, a standard CMOS sensor manufacturing method may be employed, the positioning of the pixels in relation to one another and the shape of the luminance cells being selected according to the approach described here.

Exemplary embodiments of the present invention are depicted in the figures and explained in greater detail below.

DETAILED DESCRIPTION OF EXAMPLE EMBODIMENTS

Figure 1:
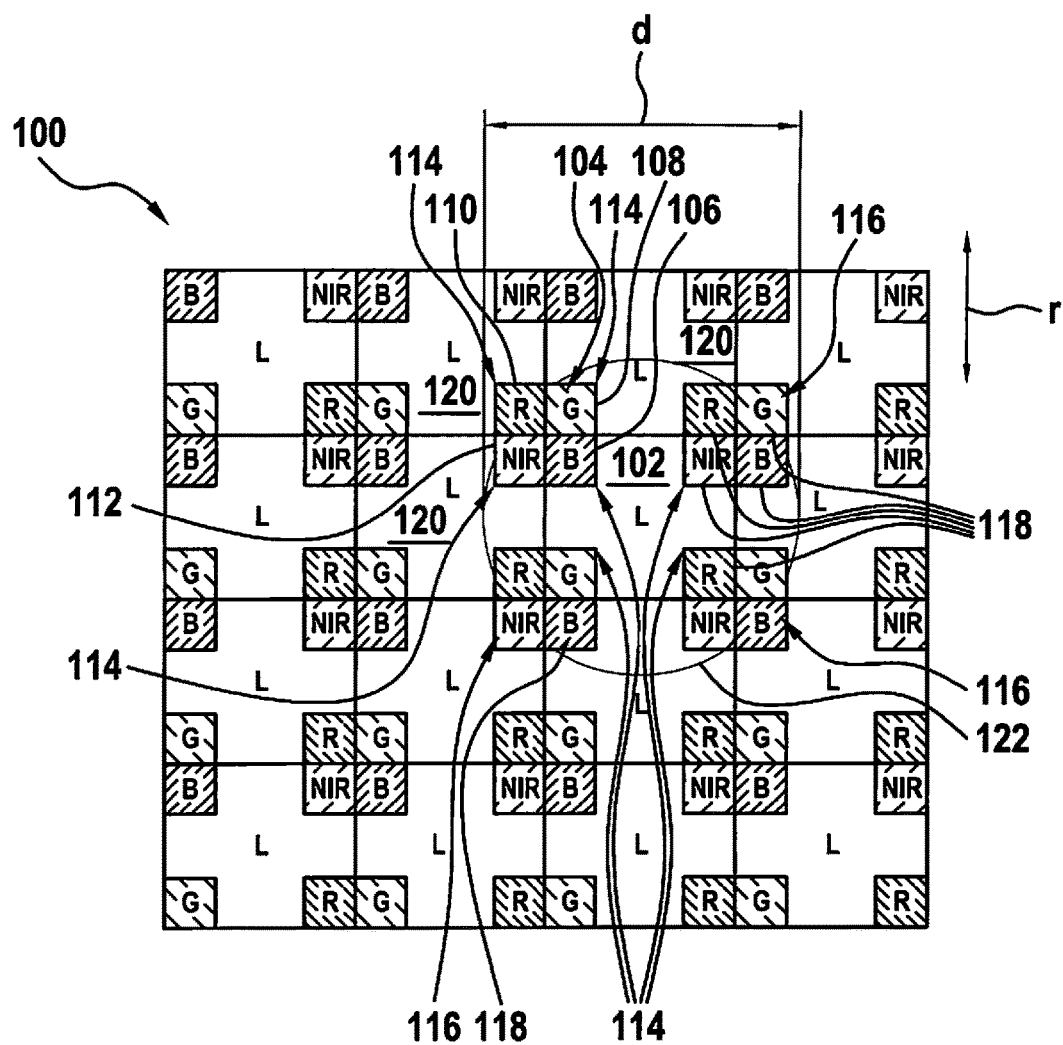
FIG. 1 shows a schematic representation of a sensor array according to one exemplary embodiment.

In the description below of favorable exemplary embodiments of the present invention, identical or similar reference numerals are used for the elements shown in the different figures and elements acting in a similar way, a repeated description of these elements being omitted.

FIG. 1 shows a schematic representation of a sensor module 100 in the form of a sensor array according to one exemplary embodiment. Sensor module 100 includes a brightness sensor element 102 for detecting a brightness of an electromagnetic radiation as well as a color sensor field 104 including a color sensor element 106. Color sensor element 106 is made up of four individual addressable cells having different color filters and is designed for detecting a color of the electromagnetic radiation. Brightness sensor element 102 is implemented to have a significantly larger sensor surface than the color sensor field 104. Depending on the exemplary embodiment, a sensor surface of brightness sensor element 102 is at least twice as large as a sensor surface of color sensor field 104.

According to this exemplary embodiment, color sensor field 104 includes, in addition to color sensor element 106, for example, a first additional color sensor element 108, a second additional color sensor element 110 and a third additional color sensor element 112. Four color sensor elements 106, 108, 110, 112 are each sensitive to a different wavelength range of the electromagnetic radiation. For example, color sensor element 106 is sensitive to the color blue, first additional color sensor element 108 to the color green, second additional color sensor element 110 to the color red, and third additional color sensor element 112 to near infrared. The four color sensor elements are each formed to be essentially square in shape and situated in such a way that color sensor field 104 also has an essentially square shape. Four color sensor elements 106, 108, 110, 112 may be essentially of equal size. Each of color sensor elements 106, 108, 110, 112 as well as brightness sensor element 102 represent light sensor elements of sensor module 100.

Brightness sensor element 102 is in the shape of a cross having four indentations 114, each of four indentations 114 being delimited by two beams of the cross. A segment of color sensor field 104 is situated in one of indentations 114. Color sensor field 104 is placed in indentation 114 in such a way that color sensor element 106 completely fills indentation 114, i.e., a size of indentation 114 essentially corresponds to a size of color sensor element 106.

According to the exemplary embodiment shown in FIG. 1, sensor module 100 is implemented in addition to color sensor field 104 to have a plurality of additional color sensor fields 116, which, similar to color sensor field 104, each have four additional color sensor elements 118 of essentially the same size. Four additional color sensor elements 118 of each additional color sensor field 116 are, for example, likewise each sensitive to a different wavelength range of the electromagnetic radiation, for example, to the colors red, green, blue and near infrared. In this case, an additional color sensor field 116 is situated in each of three remaining indentations 114 of brightness sensor element 102 in such a way that three remaining indentations 114 are likewise completely filled by an additional color sensor element 118. Additional color sensor elements 118 situated in indentations 114 are each, for example, sensitive to a different wavelength range of the electromagnetic radiation, in FIG. 1, for example, to the colors green, red and near infrared.

Color sensor field 104 and additional color sensor fields 116 may be essentially of equal size.

In addition to brightness sensor element 102, sensor module 100 is optionally implemented to have a plurality of additional brightness sensor elements 120 which have essentially the same size and the same shape as brightness sensor element 102. Thus, each of additional brightness sensor elements 120 are also implemented to have four indentations 114. As is apparent in FIG. 1, three additional color sensor elements 108, 110, 112 of color sensor field 104 are each situated in an indentation 114 of an additional brightness sensor element 120 situated adjacent to brightness sensor element 102.

According to one exemplary embodiment, color sensor field 104 is situated partially within a circumference 122 around a center point of brightness sensor element 102. Circumference 122 has a diameter d which corresponds to no more than twice distance r between two brightness sensor elements. For example, distance r represents a distance between the particular center points of two adjacent brightness sensor elements. In FIG. 1, diameter d corresponds, for example, to 1.5 times distance r.

If an optical system having a circle of confusion corresponding to 1.5 r is used, the color of a point light source may still be clearly recognized in that, for example, L-sensor elements 102 and adjacent R, G, B-NIR sensor elements 114 (NIR=near infrared) are calculated using a suitable algorithm into a pixel having a luminance value and a chrominance coordinate.

Using a suitable other algorithm, a pixel having a luminance value and a chrominance coordinate may also be calculated from four color sensor elements each, for example, sensor elements 106, 108, 110, 112.

Consequently, a luminance value and chrominance coordinates are available for further processing for each L-sensor cell, e.g., sensor cell 102, and luminance value and chrominance value for each color cluster, e.g., color cluster 104, whereby the spatial frequency, which may still be represented meaningfully, still amounts to 1 LP/d for both color and luminance. Simultaneously, a particularly light-intensive luminance signal having a half resolution is available for the comparatively large L-sensor element.

When designing a sensor, it is important to find a good compromise between light sensitivity, spatial resolution, color fidelity and costs. A high light sensitivity may be achieved in a given process, for example, by using larger L-sensor cells. The spatial resolution may be increased by larger arrays, i.e., by a larger number of sensor cells. The color fidelity may be improved by a preferably fine spectral dispersion, which is well adapted to human perception, and reconstruction of the colors. The costs are significantly influenced by a total area of the sensor.

Against this background, various exemplary embodiments of sensor module 100 are presented below, which represent an economical and effective approach for systems for machine vision in the automotive field.

An HDR sensor (High Dynamic Range Sensor) having an RGGB pattern may be used, for example, as a reference sensor. The HDR sensor may have the following features:
 Array size: 2 megapixels (1920×1180) sensor cells
 Orthogonal positioning on grid of 3 µm pixel spacing
 Theoretically minimal resolvable spatial frequency without luminance aliasing: approximately 80 lp/mm; 4 pixels per line pair or 2 pixels per line
 Theoretically minimal resolvable spatial frequency without color aliasing: approximately 55 lp/mm; 6 pixels per line pair or 3 pixels per line
 Signal-to-noise ratio 1 in the luminance channel at 3 lux
 Compared to the reference sensor, sensor module 100 has a higher number of individual sensors (5 times as many) but occupies the same area as the reference sensor. A spatial frequency resolution for contrast and color is, for example, approximately 80 lp/mm for sensor module 100. The signal-to-noise ratio is, for example, 1 in the luminance channel at significantly less than 3 lux.

A sensor module described in the following makes it possible to combine a high-resolution intensity or gray-scale image with an equally high-resolution color measurement.

In order to achieve this at a dedicated optical resolution and a circle of confusion resulting from a design of an optical system, the sensor cells which produce the gray-value image, also referred to above as brightness sensor elements, should be significantly larger than the cells for detecting the color, also referred to above as color sensor elements.

For this purpose, the sensor cells should be positioned in such a way that, in the circumference of a maximum of two times distance r between two brightness sensor elements, a sufficient number of color sensor elements are present which are suitable for determining a color location. For example, the color sensor elements may be situated symmetrically to the brightness sensor elements. The brightness sensor elements may be, for example, wideband luminance cells.

For an optimized system for detecting objects in highly differently illuminated scenes, as is the case, for example, in the automotive field, the required high sensitivity for a gray-value-based object recognition may be achieved by a dense grid of brightness sensor elements, for example, wideband-sensitive light sensors without a color mask. The brightness sensor elements should allow a good contrast separation even with little illumination. For example, the brightness sensor elements are designed as logarithmic or quasilogarithmic sensors. The color sensor elements may have a linear characteristic curve, since the color signal reconstruction may be carried out in a standard manner and therefore cost-effectively on a linear signal. The color reconstruction should be available only from an average brightness, since the objects to be classified are mostly self-luminous, such as car headlights, taillights or self-luminous traffic signs, or are well-illuminated such as street signs or markings in daytime or in the headlights.

Such a sensor module offers a number of advantages.

Thus, the detection of a brightness signal via a luminance or gray-value channel may be carried out independently of a color measurement using a wideband, highly sensitive sensor, which allows a good signal-to-noise ratio even with little illumination. The intensity signal should not be reconstructed from distributedly measured noise-limited signals, but be instead measured directly. The signal quality defined by the signal-to-noise ratio may be, for example, 30 percent greater than that of a reconstructed signal.

The detection of the color location may be measured symmetrically to the intensity signal. The color location may be, for example, assigned as a UV component to a central intensity value.

A fourth color channel, which allows a separation of an infrared component of the received radiation, does not reduce the luminance resolution of the sensor module, but instead allows the use of a wideband optical system open to the near-infrared range of more than 650 nm, since the NIR signal components resulting in metamerism, separately detected and weighted, may be removed from the RGB channels, in order to remove the interfering influence from the color calculation.

Symmetrically to an intensity pixel in the form of the brightness sensor element, four color samples are measured at each corner of the intensity pixel and are used, for example, for plausibility checking or correction of a color value for the central intensity pixel. Color aliasing may be effectively suppressed if the resolution limit of the optical system is 1.5 times an intensity pixel raster.

The separation of the intensity and color measuring channels allows the use of different optimally adapted sensor readout structures and transfer characteristic curves, for example, contrast-retaining logarithmic for the intensity channel and linear for a simple color reconstruction in the color channels.

Sensor module 100 may be characterized, for example, as follows.

On the one hand, sensor module 100 has separate sensor elements for a wideband intensity detection and color detection. Intensity detection takes place, for example, with the aid of luminance sensors. The color detection takes place, for example, with the aid of RGBNIR sensors.

In this case, the color sensor elements are significantly smaller than the brightness sensor elements. The brightness sensor elements are, for example, ten times as large as the color sensor elements. In this case, the color sensor elements may be positioned in clusters, in particular in RGBNIR clusters, between the brightness sensor elements.

Sensor module 100 has numerically significantly more color sensor elements than brightness sensor elements, the color sensor elements being smaller in surface area than the brightness sensor elements. Nonetheless, the brightness sensor elements cover a large part of a sensor surface of sensor module 100, for example, approximately 75 percent of the sensor surface.

The brightness sensor elements are highly dynamic sensor cells which have a logarithmic or section-wise linear characteristic in order to avoid saturation during strong irradiation and to be able to detect a sufficient number of photons at low irradiation. This makes it possible to generate a low-noise signal.

The color sensor elements are aligned symmetrically to the brightness sensor elements.

According to one exemplary embodiment, sensor module 100 is implemented as an image sensor array including a plurality of individual sensor elements, the individual sensor elements differing considerably in size from one another, for example, by at least a factor of three.

For example, sensor module 100 has at least four times as many small sensor elements as large sensor elements.

In this case, the small sensor elements may be embedded in clusters, for example, in two-by-two clusters, between the large sensor elements.

The large sensor elements may represent a total of at least two-thirds of a sensor array surface, the small sensor elements being able to represent a maximum of one-third of the sensor array surface.

The large sensor elements are designed as brightness sensor elements, for example, as intensity sensors without or with a wideband spectral filter. The small sensor elements are color sensor elements, which may be covered with a color filter layer.

The color sensor elements may be positioned point-symmetrically to a brightness sensor element.

The brightness sensor elements and the color sensor elements may differ from one another with respect to a pixel transfer characteristic. For example, the brightness sensor elements have a logarithmic or quasilogarithmic characteristic, while the color sensor elements may have a linear characteristic.

Sensor module 100 may, for example, be implemented on a silicon surface.

Figure 2:
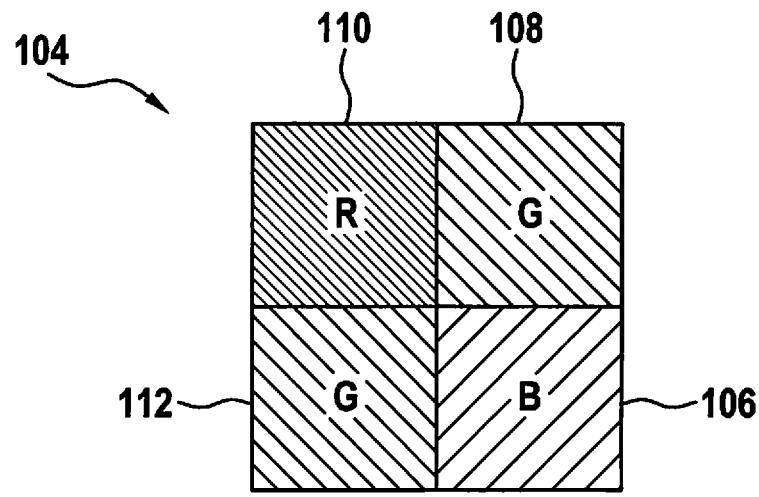
FIG. 2 shows a schematic representation of a color sensor field according to one exemplary embodiment including a 3-channel color filter.

FIG. 2 shows a schematic representation of a color sensor field 104 including a 3-channel color filter according to one exemplary embodiment. Color sensor field 104 essentially corresponds to the color sensor field described with reference to FIG. 1, the difference being that third additional color sensor element 112 as well as first additional color sensor element 108 are sensitive to the color green. A color pattern of color sensor field 104 corresponds, for example, to a typical RGGB Bayer pattern.

Figure 3:
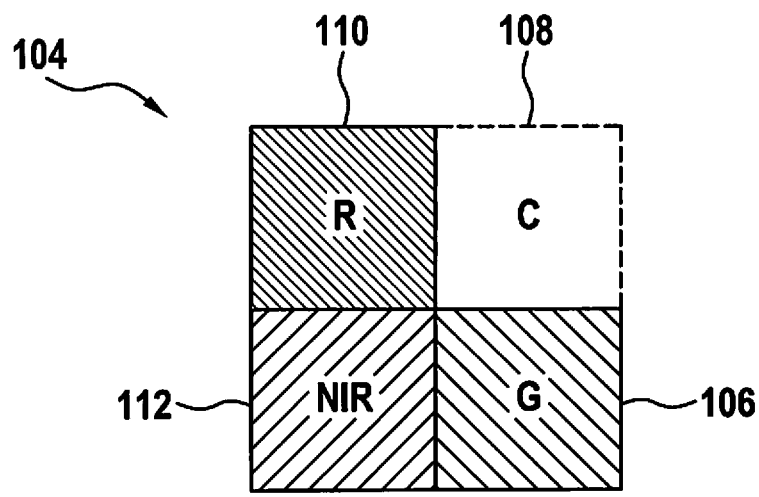
FIG. 3 shows a schematic representation of a color sensor field according to one exemplary embodiment including a 4-channel color filter.

FIG. 3 shows a schematic representation of a color sensor field 104 including a 4-channel color filter according to one exemplary embodiment. Color sensor field 104 essentially corresponds to the color sensor field described with reference to FIG. 1, the difference being that first additional color sensor element 108 is covered by a wideband open filter denoted by the letter C in FIG. 3. Furthermore, color sensor element 106 of FIG. 3 is sensitive to the color green. According to this exemplary embodiment, color sensor field 104 is implemented to have a highly transparent pattern. In this case, third additional color sensor element 112 functions as an NIR pass filter having a transmissibility for wavelengths from 650 nm.

Figure 4:
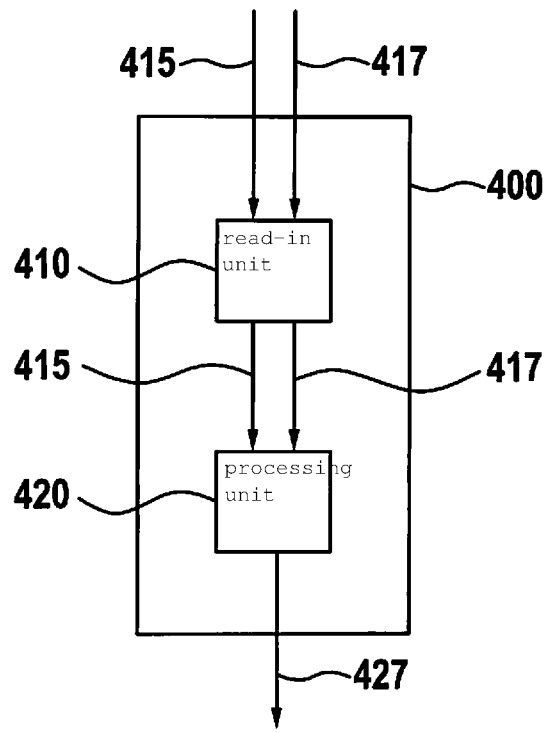
FIG. 4 shows a schematic representation of a device according to one exemplary embodiment.

FIG. 4 shows a schematic representation of a device 400 according to one exemplary embodiment. Device 400 is used for ascertaining a brightness or a color of an electromagnetic radiation, for example, using a sensor module as described above with reference to FIGS. 1 through 3. For this purpose, device 400 includes a read-in unit 410 which is designed for reading in, via an interface to the sensor module, a brightness value 415 which represents a brightness detected by the brightness sensor element. In addition or alternatively, read-in unit 410 is designed for reading in, via the interface, a color value 417 which represents a color detected by the color sensor element of the color sensor field. Depending on the exemplary embodiment, read-in unit 410 forwards brightness value 415 or color value 417 or both values to a processing unit 420, which is designed for ascertaining the brightness or the color of the electromagnetic radiation using at least one of the two values 415, 417 and outputting a resultant value 427 representing the ascertained brightness or color.

Figure 5:
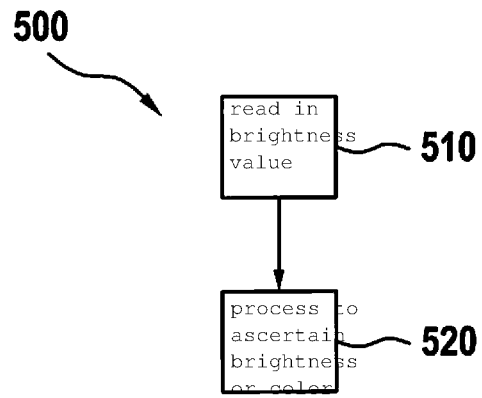
FIG. 5 shows a flow chart of a method for ascertaining a brightness and/or a color of an electromagnetic radiation using a sensor module according to one exemplary embodiment.

FIG. 5 shows a flow chart of a method 500 for ascertaining a brightness and/or a color of an electromagnetic radiation using a sensor module according to one exemplary embodiment. Method 500 may, for example, be carried out in connection with a device described above with reference to FIG. 4. In this case, the brightness value is read in in a step 510. In addition or alternatively, the color value is read in in step 510. In a step 520, the brightness value or the color value is processed to ascertain the brightness or the color of the electromagnetic radiation.

Figure 6:
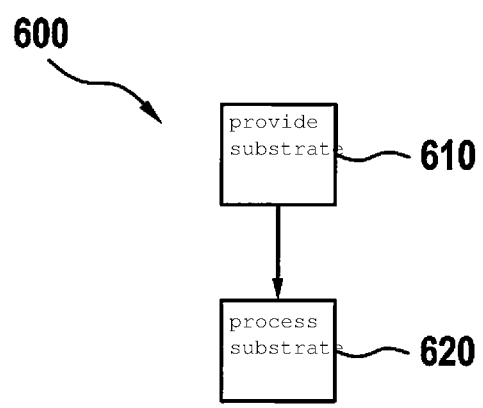
FIG. 6 shows a flow chart of a method for manufacturing a sensor module according to one exemplary embodiment.

FIG. 6 shows a flow chart of a method 600 for manufacturing a sensor module according to one exemplary embodiment. Method 600 may, for example, be carried out for manufacturing a sensor module, as described above with reference to FIGS. 1 through 5. Method 600 includes an optional step 610 in which a substrate, such as a silicon carrier, is provided. In a step 620, the substrate is processed, for example in a suitable method of semiconductor technology, to provide at least one brightness sensor element for detecting a brightness of an electromagnetic radiation and at least one color sensor field, which has at least one color sensor element for detecting a color of the electromagnetic radiation. The substrate is processed in such a way that a sensor surface of the brightness sensor element is significantly larger than a sensor surface of the color sensor field.

If an exemplary embodiment includes an "and/or" link between a first feature and a second feature, this is to be read in such a way that the exemplary embodiment according to one specific embodiment has both the first feature and the second feature, and according to another specific embodiment, either only the first feature or only the second feature.

What is claimed is:

1. A sensor module, comprising:
   at least one brightness sensor element for detecting a brightness of a wideband electromagnetic radiation; and
   at least one color sensor field having at least one color sensor element for detecting a color of the electromagnetic radiation, the brightness sensor element having a larger sensor surface than the color sensor field.

2. The sensor module as recited in claim 1, wherein the brightness sensor element has at least twice as large a sensor surface as the color sensor field.

3. The sensor module as recited in claim 1, wherein the sensor module has a larger number of at least one of color sensor fields and color sensor elements, than brightness sensor elements.

4. The sensor module as recited in claim 1, wherein the color sensor field has at least one additional color sensor element for detecting an additional color of the electromagnetic radiation.

5. The sensor module as recited in claim 1, wherein the brightness sensor element has at least one indentation, the color sensor field being at least partially situated in the indentation.

6. The sensor module as recited in claim 1, further comprising:
   at least one of: i) at least one additional brightness sensor element for detecting the brightness of the electromagnetic radiation, and ii) at least one additional color sensor field which includes at least one additional color sensor element for detecting the color of the electromagnetic radiation, the additional brightness sensor element having a larger sensor surface than at least one of the color sensor field and the additional color sensor field.

7. The sensor module as recited in claim 6, wherein the color sensor field and the additional color sensor field in relation to the brightness sensor element are situated point-symmetrically to one another.

8. The sensor module as recited in claim 6, wherein at least one of the color sensor field and the additional color sensor field is situated at least partially within a circumference around a center point of the brightness sensor element, a diameter of the circumference maximally corresponding to double a distance between the center point of the brightness sensor element and a center point of the additional brightness sensor element.

9. The sensor module as recited in claim 6, wherein at least one of: i) the brightness sensor element and the additional brightness sensor element are of equal size, and ii) the color sensor field and the additional color sensor field are of equal size.

10. A method for ascertaining at least one of a brightness and a color of an electromagnetic radiation using a sensor module including at least one brightness sensor element for detecting a brightness of a wideband electromagnetic radiation, and at least one color sensor field having at least one color sensor element for detecting a color of the electromagnetic radiation, the brightness sensor element having a larger sensor surface than the color sensor field, the method comprising:
   reading in at least one of: i) a brightness value of a brightness detected by the brightness sensor element, and ii) a color value which represents a color detected by the color sensor element; and
   processing the at least one of the brightness value and the color value to ascertain at least one of a brightness and a color, of the electromagnetic radiation.

11. A method for manufacturing a sensor module, comprising:
   machining a substrate in order to form at least one brightness sensor element for detecting a brightness of an electromagnetic radiation and at least one color sensor field, which includes at least one color sensor element for detecting a color of the electromagnetic radiation, the substrate being machined in such a way that the brightness sensor element has a larger sensor surface than the color sensor field.

* * * * *